(12) United States Patent
Kao et al.

(10) Patent No.: US 9,893,197 B2
(45) Date of Patent: Feb. 13, 2018

(54) THIN FILM TRANSISTOR SUBSTRATE, MANUFACTURING METHOD THEREOF, AND LIQUID CRYSTAL DISPLAY PANEL USING SAME

(71) Applicant: HON HAI PRECISION INDUSTRY CO., LTD., New Taipei (TW)

(72) Inventors: Yi-Chun Kao, Hsinchu (TW); Hsin-Hua Lin, Hsinchu (TW); Chih-Lung Lee, Hsinchu (TW); Kuo-Lung Fang, Hsinchu (TW); Po-Li Shih, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 326 days.

(21) Appl. No.: 14/752,429

(22) Filed: Jun. 26, 2015

(65) Prior Publication Data

US 2016/0190327 A1    Jun. 30, 2016

(30) Foreign Application Priority Data

Dec. 25, 2014 (CN) .......................... 2014 1 0819642

(51) Int. Cl.
| | |
|---|---|
| *G02F 1/1335* | (2006.01) |
| *G02F 1/1368* | (2006.01) |
| *H01L 29/786* | (2006.01) |
| *H01L 27/12* | (2006.01) |
| *G02F 1/1343* | (2006.01) |
| *G02F 1/1362* | (2006.01) |

(52) U.S. Cl.
CPC ........ *H01L 29/7869* (2013.01); *G02F 1/1368* (2013.01); *H01L 27/127* (2013.01); *H01L 27/1225* (2013.01); *H01L 29/78603* (2013.01); *G02F 2001/134372* (2013.01); *G02F 2001/136222* (2013.01)

(58) Field of Classification Search
None
See application file for complete search history.

(56) References Cited

U.S. PATENT DOCUMENTS

| | | | | |
|---|---|---|---|---|
| 2004/0058490 | A1* | 3/2004 | Ishii | ................. H01L 21/76243 438/229 |
| 2005/0014319 | A1* | 1/2005 | Yamazaki | ............... H01L 27/12 438/197 |
| 2010/0123131 | A1* | 5/2010 | Tokunaga | ......... H01L 29/41733 257/43 |
| 2010/0203673 | A1* | 8/2010 | Hayashi | ............ H01L 29/78618 438/104 |

(Continued)

FOREIGN PATENT DOCUMENTS

| | | |
|---|---|---|
| CN | 1577775 A | 2/2005 |
| EP | 2206155 B1 | 11/2013 |

*Primary Examiner* — Ryan Crockett
(74) *Attorney, Agent, or Firm* — ScienBiziP, P.C.

(57) ABSTRACT

A thin film transistor (TFT) includes a substrate, a TFT formed on the substrate, and a passivation layer formed on the TFT. The TFT includes a gate, a source, a drain, and a channel layer. The source and the drain are respectively located at opposite sides of the channel layer. The channel layer includes oxygen ions which are implanted into the channel layer by an oxygen implanting process performed in an environment having an air pressure greater than a standard atmospheric pressure.

16 Claims, 12 Drawing Sheets

(56) References Cited

U.S. PATENT DOCUMENTS

2012/0218495 A1* 8/2012 Oshima .............. H01L 27/1225
  349/61
2013/0056729 A1* 3/2013 Misaki ................ H01L 27/1225
  257/43
2014/0239291 A1* 8/2014 Son ................... H01L 29/66969
  257/43

* cited by examiner

THIN FILM TRANSISTOR SUBSTRATE, MANUFACTURING METHOD THEREOF, AND LIQUID CRYSTAL DISPLAY PANEL USING SAME

CROSS-REFERENCE TO RELATED APPLICATIONS

This application claims priority to Chinese Patent Application No. 201410819642.4 filed on Dec. 25, 2014, the contents of which are incorporated by reference herein.

FIELD

The subject matter herein generally relates to a thin film transistor (TFT) substrate, a manufacturing method of the TFT substrate, and an LCD panel utilizing the TFT substrate.

BACKGROUND

Generally, a liquid crystal display (LCD) panel includes a thin film transistor (TFT) substrate, a substrate opposite to the TFT substrate, and a liquid crystal layer between the TFT substrate and the opposite substrate. A TFT substrate can include a TFT array having a plurality of TFTs, each of which includes a gate, a source, a drain, and a channel layer coupling the source to the drain. Semiconductive materials, such as metal oxides, are widely used to make the channel layer.

BRIEF DESCRIPTION OF THE DRAWINGS

Implementations of the present technology will now be described, by way of example only, with reference to the attached figures.

DETAILED DESCRIPTION

Figure 1:
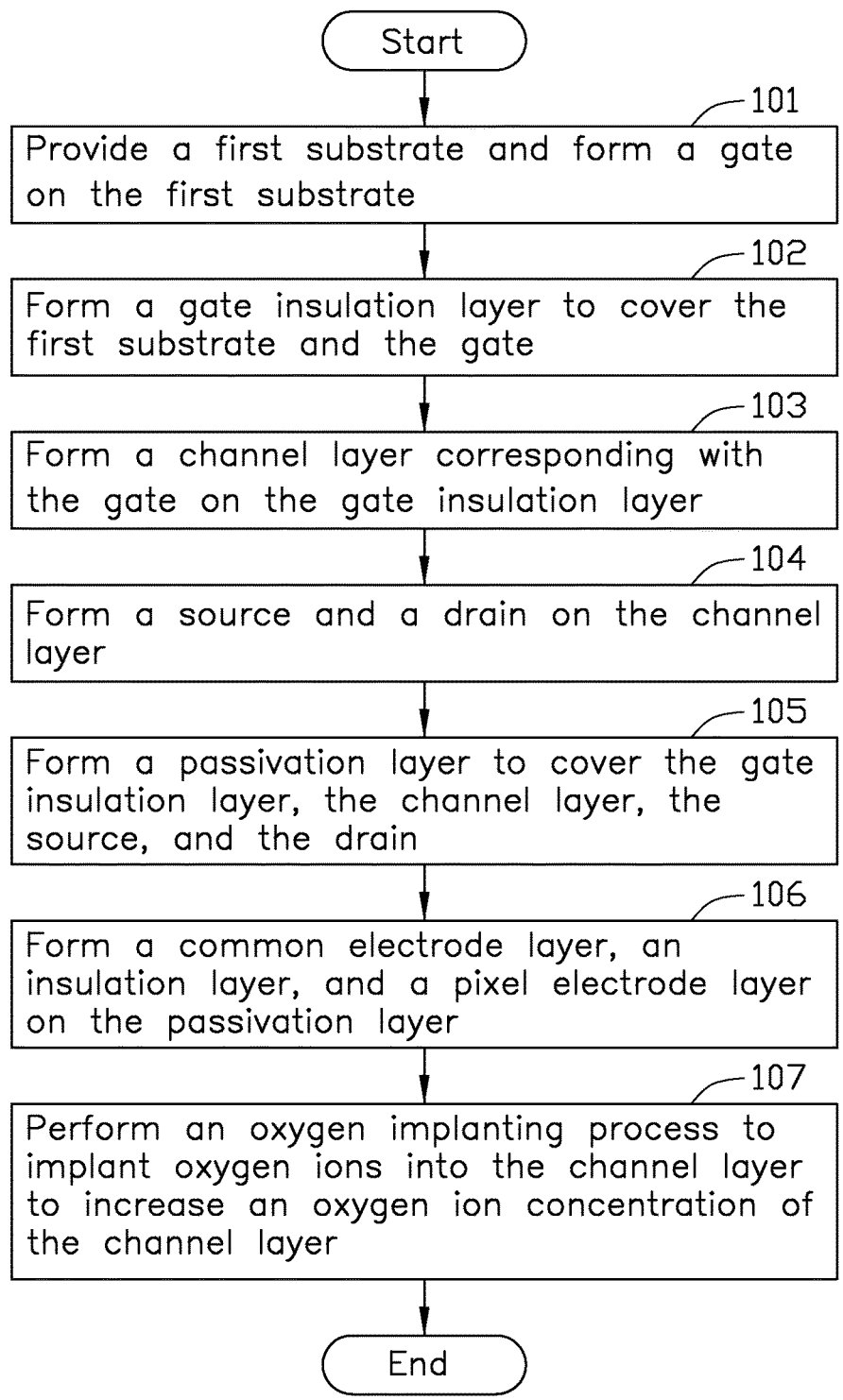
FIG. 1 is a flowchart of an exemplary method for manufacturing a thin film transistor (TFT) substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a thin film transistor (TFT) substrate, a method of manufacturing the TFT substrate, and a liquid crystal display (LCD) panel having the TFT substrate.

FIG. 1 illustrates a flowchart of a method for manufacturing a TFT substrate 11. The method is provided by way of example, as there are a variety of ways to carry out the method. Each block shown in FIG. 1 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 101.

Figure 2:
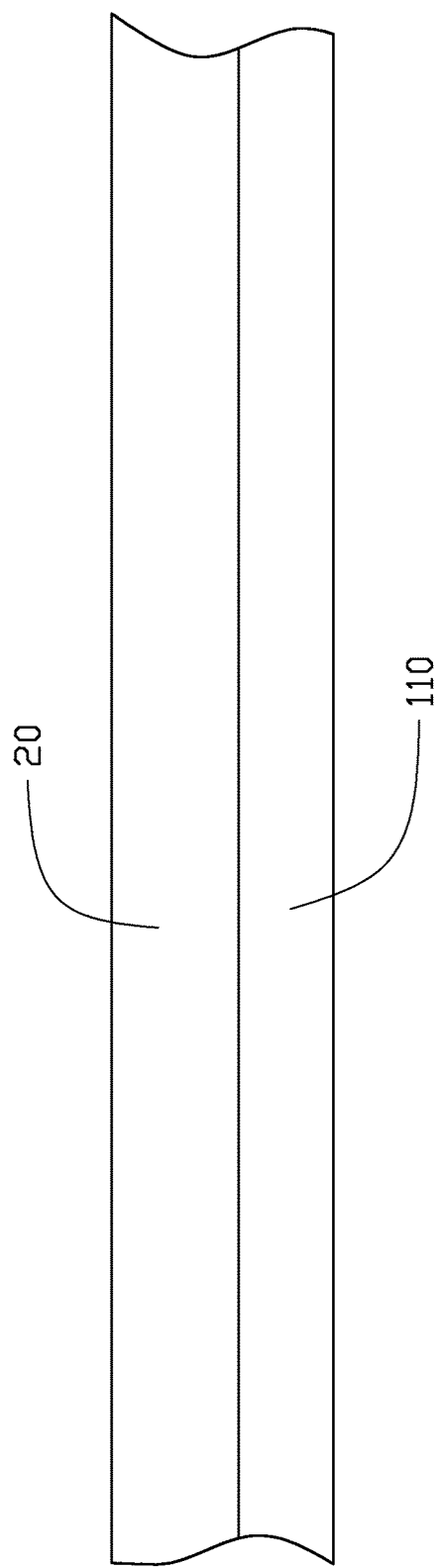
FIG. 2 illustrates a layer of conductive materials coated on a first substrate to form a first conductive layer.
Figure 3:
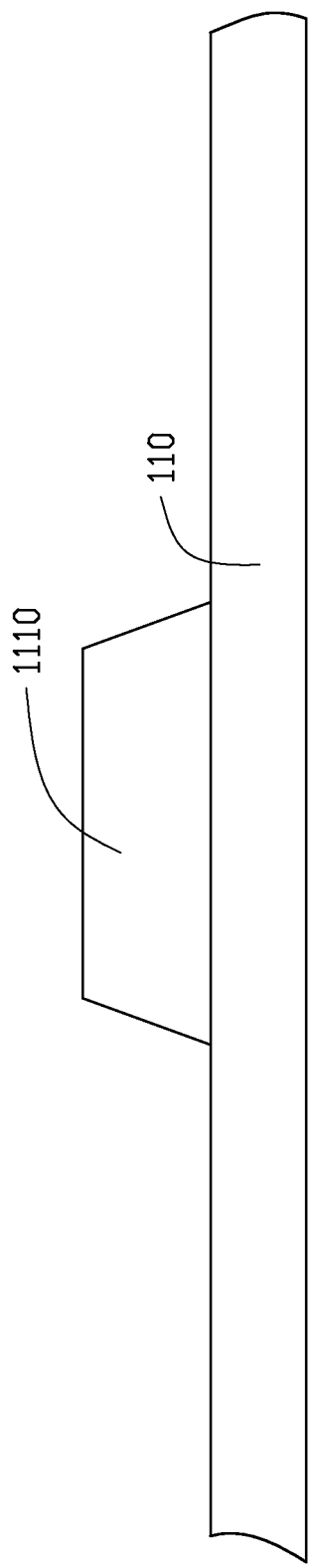
FIG. 3 illustrates the first conductive layer of FIG. 2 patterned to form a gate on the first substrate.

At block 101, a first substrate 110 is provided and a gate 1110 is formed on the first substrate 110. In at least one embodiment, referring to FIG. 2, a layer of conductive materials is coated on the first substrate 110 to form a first conductive layer 20. Then, referring to FIG. 3, the first conductive layer 20 is patterned to form the gate 1110 on the first substrate 110. The first conductive layer 20 can be patterned using, for example, a photo etching process (PEP). The conductive materials can be metal materials, metal alloy materials, or metal oxide materials. The first substrate 110 can be a transparent substrate such as a glass substrate or a quartz substrate. In other embodiments, the first substrate 110 can be a non-transparent substrate, a translucent substrate, or a flexible substrate.

Figure 4:
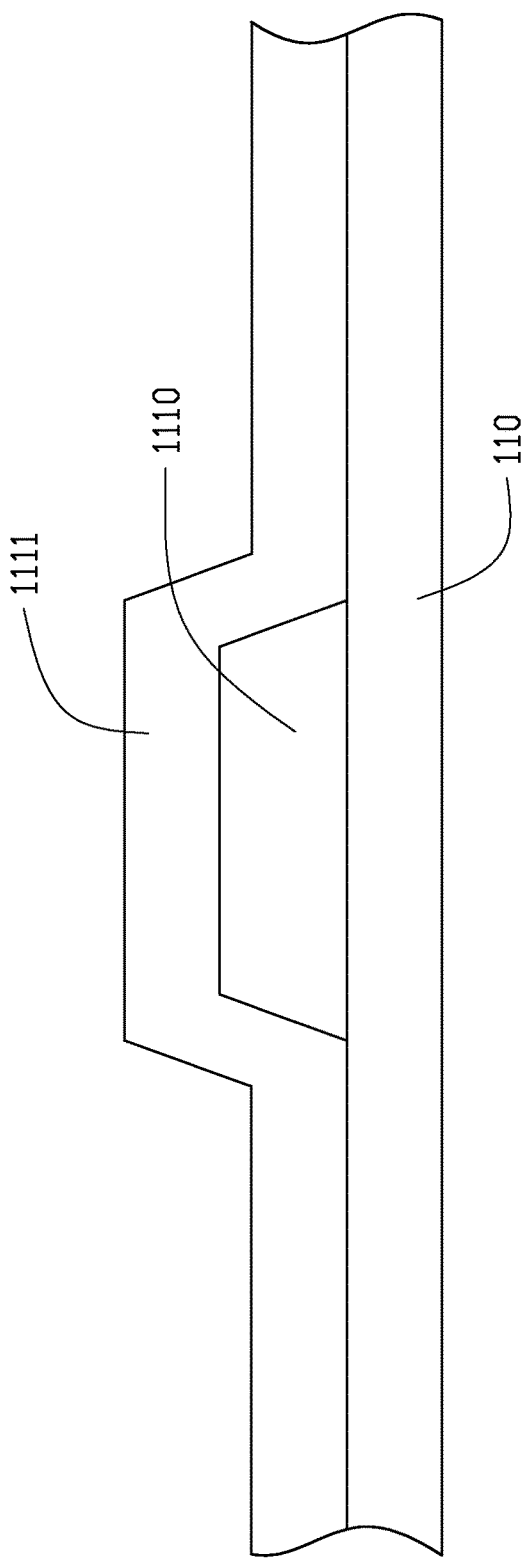
FIG. 4 illustrates a gate insulation layer formed on the first substrate and the gate.

At block 102, referring to FIG. 4, a gate insulation layer 1111 is formed on the first substrate 110 and the gate 1110 to cover the gate 110 and the first substrate 110. In at least one embodiment, a layer of insulation materials is coated on the gate 1110 and the first substrate 110 to form the gate insulation layer 1111. The gate insulation layer 1111 can be made of inorganic materials such as silicon nitride ($SiN_x$) and silicon oxide ($SiO_x$). The method for forming the gate insulation layer 1111 can be, for example, a plasma chemical vapor deposition (PCVD) method.

Figure 5:
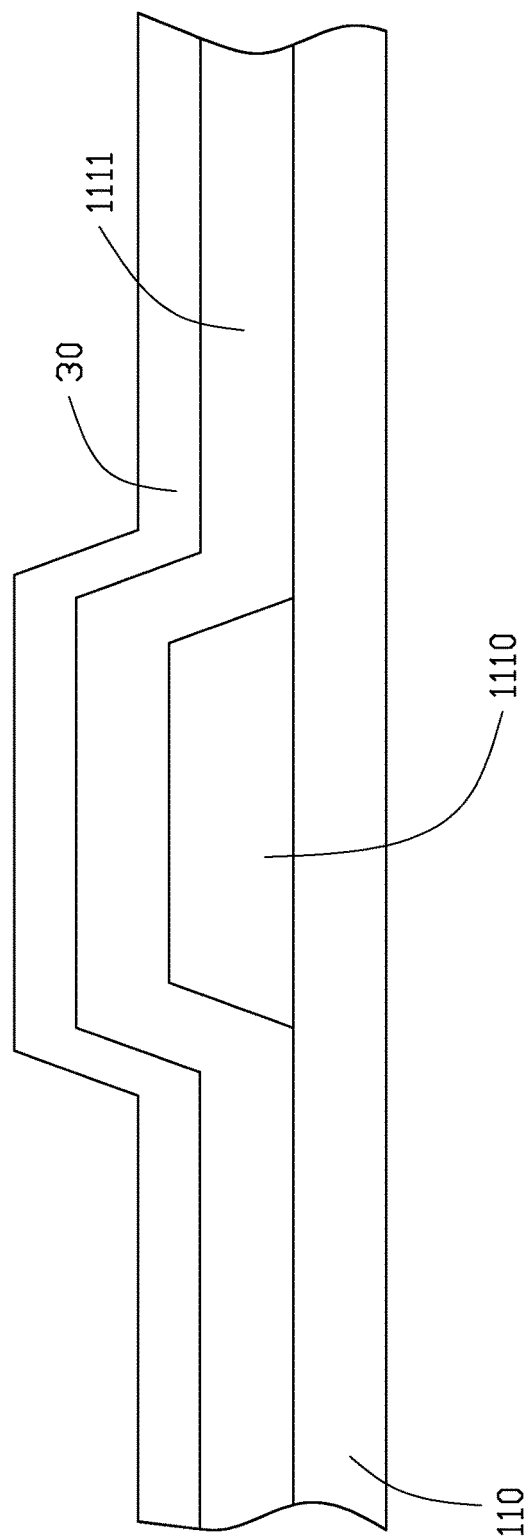
FIG. 5 illustrates a layer of metal oxide materials coated on the gate insulation layer to form a metal oxide semiconductor layer.
Figure 6:
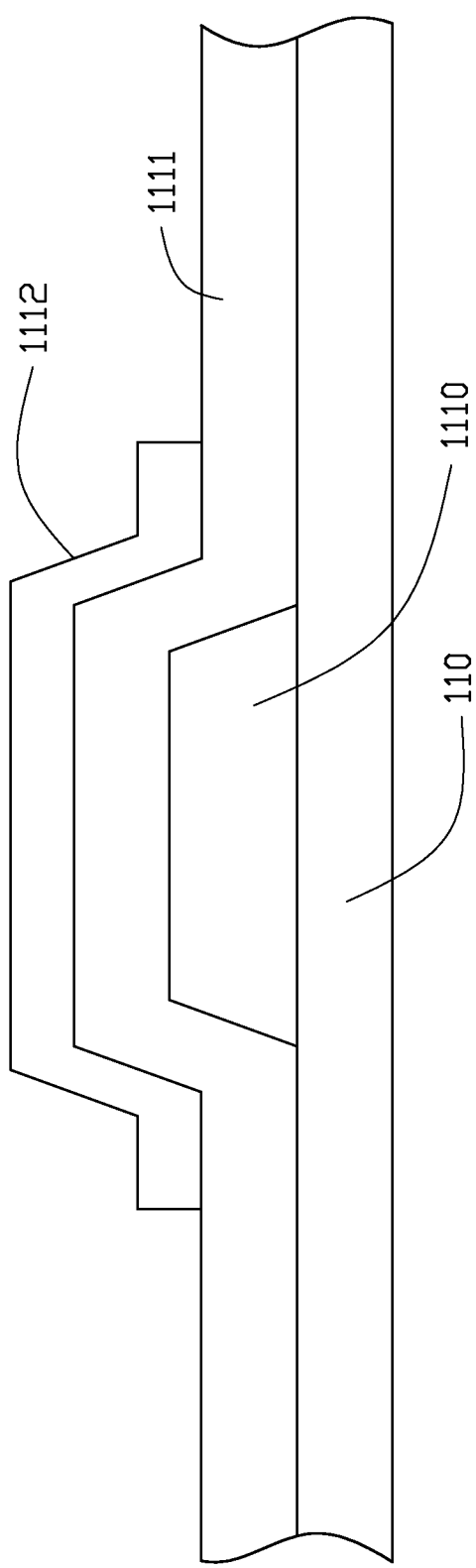
FIG. 6 illustrates the metal oxide semiconductor layer patterned to form a channel layer on the gate insulation layer to correspond with the gate.

At block 103, a channel layer 1112 corresponding with the gate 1110 is formed on the gate insulation layer 1111. In at least one embodiment, referring to FIG. 5, a layer of metal oxide materials is coated on the gate insulation layer 1111 to form a metal oxide semiconductor layer 30. The metal oxide materials can be indium gallium zinc oxide (IGZO), indium zinc oxide (IZO), or other like materials. Then, as shown in FIG. 6, the metal oxide semiconductor layer 30 is patterned using, for example, a PEP method to form the channel layer 1112 on the gate insulation layer 1111 to correspond with the gate 1110.

Figure 7:
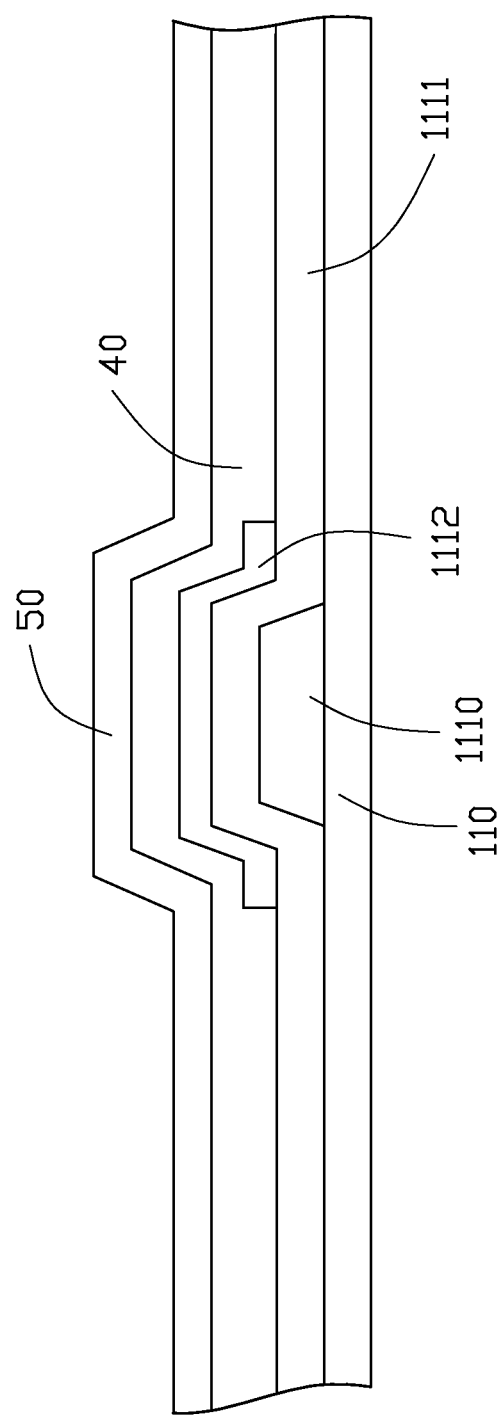
FIG. 7 illustrates a layer of conductive materials formed on the channel layer and the gate insulation layer.
Figure 8:
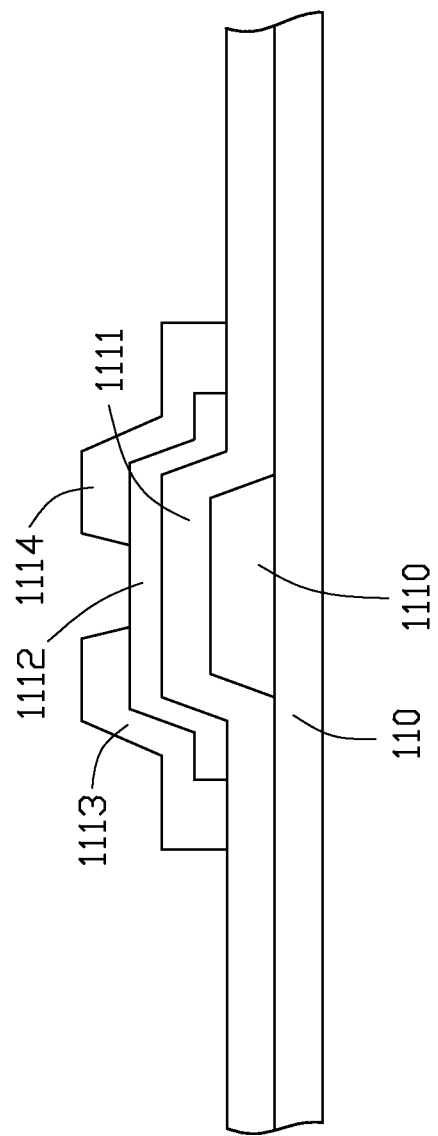
FIG. 8 illustrates a source and a drain formed on the channel layer.

At block 104, a source 1113 and a drain 1114 are formed on the channel layer 1112. In at least one embodiment, as shown in FIG. 7, a layer of conductive materials is formed on the channel layer 1112 and the gate insulation layer 1111 and cover the channel layer 1112 and the gate insulation layer 1111 to form a second conductive layer 40. Then a layer of photoresist materials is coated on the second conductive layer 40 to form a photoresist layer 50. Then, as shown in FIG. 8, the photoresist layer 50 is patterned in, for example, a photo exposure process and a development process and the second conductive layer 40 is etched to form the source 1113 and the drain 1114 on the channel layer 1112. In this embodiment, the source 1113 and the drain 1114 are respectively located at opposite sides of the channel layer 1112 and coupled with the channel layer 1112. At this time, the TFT 111 including the gate 1110, the gate insulation layer 1111, the channel layer 1112, the source 1113, and the drain 1114 are formed on the first substrate 110.

Figure 9:
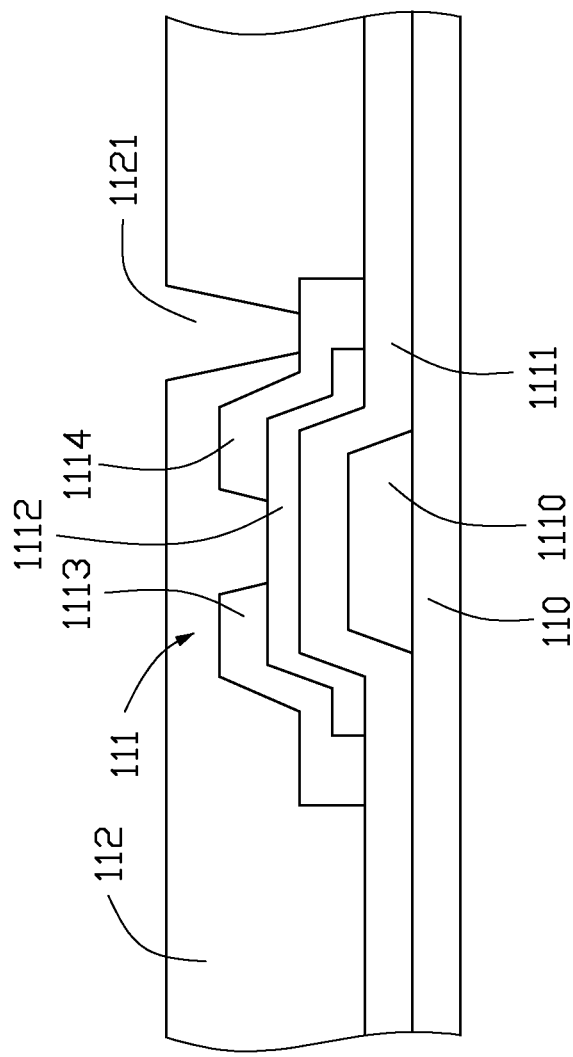
FIG. 9 illustrates a passivation layer formed to cover the gate insulation layer, the channel layer, the source, and the drain.

At block 105, as shown in FIG. 9, a passivation layer 112 is formed on TFT 111 and covers the gate insulation layer 1111, the channel layer 1112, the source 1113, and the drain 1114 of the TFT 111. Then, a contact hole 1121 passing through the passivation layer 112 is formed to correspond with the drain 1114. In at least one embodiment, the passivation layer 112 can be made of inorganic materials, such as silicon nitride ($SiN_x$), silicon oxide ($SiO_x$), or other like materials. In other embodiments, the passivation layer 112 can also be made of organic materials.

Figure 10:
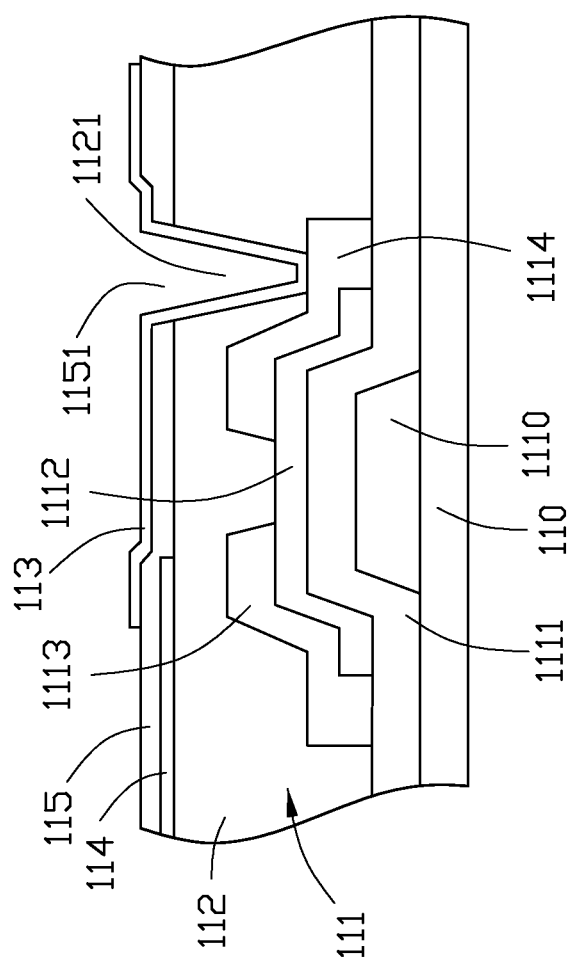
FIG. 10 illustrates a common electrode layer, an insulation layer, and a pixel electrode layer respectively formed on the passivation layer.

At block 106, as shown in FIG. 10, a common electrode layer 114, an insulation layer 115, and a pixel electrode layer 113 are respectively formed on the passivation layer 112 in that order. The insulation layer 115 defines a through hole 1151 to correspond with the contact hole 1121 to expose a portion of the drain 1114. The pixel electrode layer 113 is electrically coupled to the drain 1114 via the through hole 1151 and the contact hole 1121.

Figure 11:
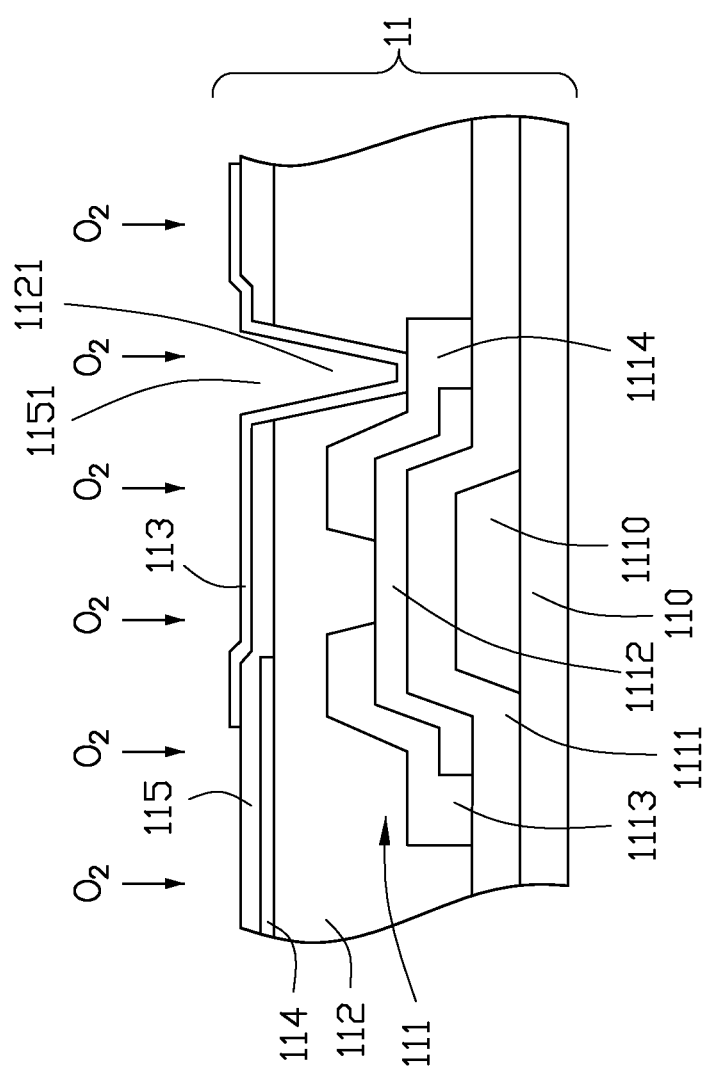
FIG. 11 illustrates an oxygen implanting process performed to implant oxygen ions into the channel layer.

At block 107, as shown in FIG. 11, an oxygen implanting process is performed to implant oxygen ions into the channel layer 1112, thereby increasing an oxygen ion concentration of the channel layer 1112. In this embodiment, the manufacturing process of the source 1113 and the drain 1114 may decrease the oxygen ion concentration of the channel layer 1112 which may decrease the conductivity of the channel layer 1112. Therefore, when the TFT substrate 11 is manufactured, an oxygen ion implanting process is needed to recover the oxygen ion concentration of the channel layer 1112. However, the channel layer 1112 is covered by the passivation layer 112, the source 1113, the drain 1114, the common electrode layer 114, and the insulation layer 115 which may block the oxygen ions to be implanted into the channel layer 1112. In order to solve this issue, in this embodiment, the ion implanting process is performed in a high air pressure environment having an air pressure greater than a standard atmospheric pressure. In at least one embodiment, the ion implanting process is performed in an annealing chamber in which an air pressure is about between two times the standard atmospheric pressure and seven times the standard atmospheric pressure. Further, a temperature in the annealing chamber is about between 200 degrees centigrade and 500 degrees centigrade, and the oxygen ion concentration in the annealing chamber is about between 20% and 50%. In a preferred embodiment, the air pressure in the annealing chamber is about between three times the standard atmospheric pressure and five times the standard atmospheric pressure, and the temperature in the annealing chamber is about 350 degrees centigrade. Since the ion implanting process is performed in a high air pressure environment, the oxygen ions can be easily implanted into the channel layer.

Further, in this embodiment, the channel layer 1112 can include at least a first portion away from the first substrate 110 and a second portion adjacent to the first substrate 110. In this embodiment, since the oxygen ions are implanted into the channel layer 1112 from a side of the passivation layer away from the first substrate 110, the oxygen ion concentration in the first portion of the channel layer 1112 is greater than the oxygen ion concentration in the second portion of the channel layer 1112.

Figure 12:
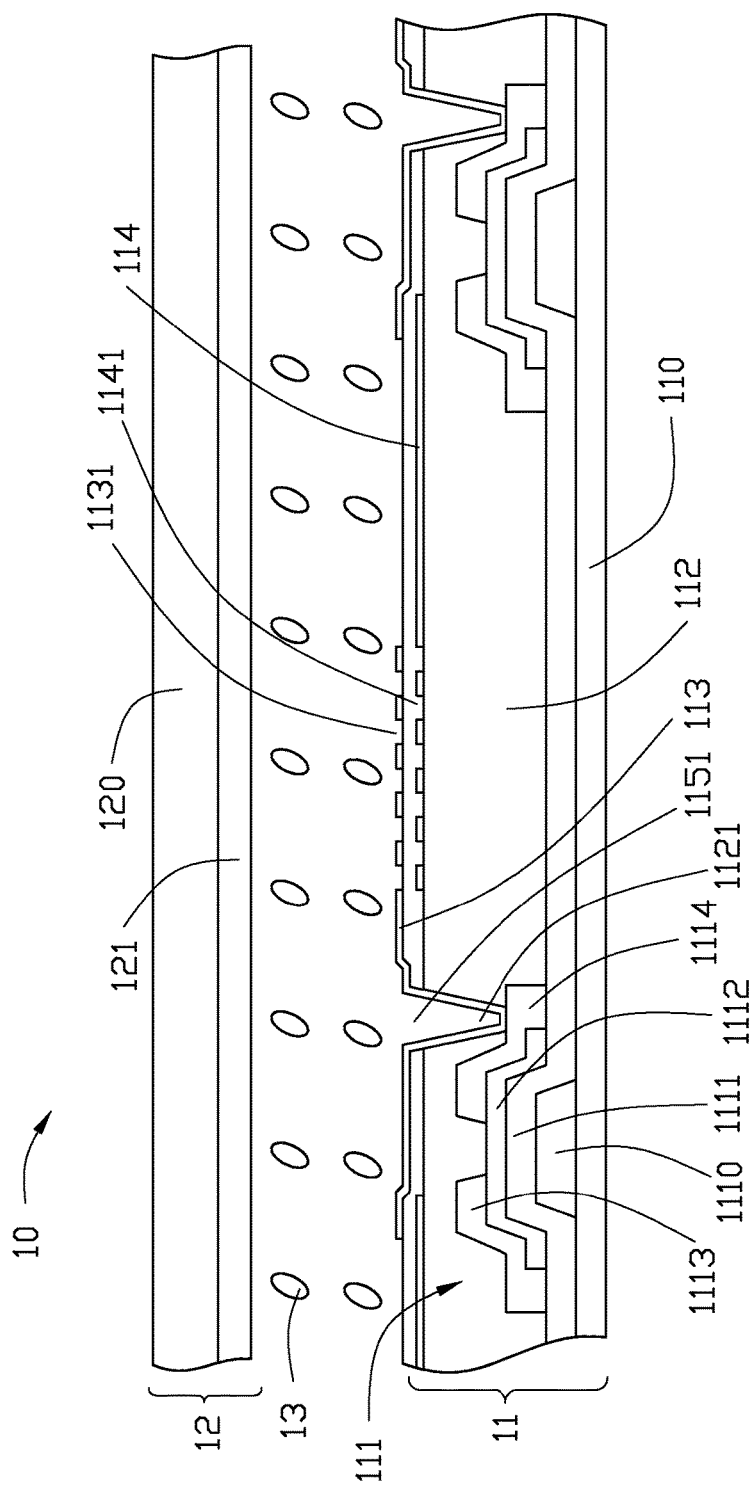
FIG. 12 illustrates a cross-sectional view of a liquid crystal display (LCD) panel.

FIG. 12 illustrates a cross-sectional view of a liquid crystal display (LCD) panel 10. The LCD panel 10 can be an in-plane switching (IPS) LCD or a fringing field switching (FFS) LCD. The LCD panel 10 includes the TFT substrate 11 formed in the above described method, a substrate 12 opposite to the TFT substrate 11, and a liquid crystal layer 13 sandwiched between the TFT substrate 11 and the opposite substrate 12. The opposite substrate 12 can be a color filter substrate of the LCD panel 10. The TFT 11 includes the first substrate 110, the TFT 111, the passivation layer 112, the pixel electrode layer 113, and the common electrode layer 114. The TFT 111, the passivation layer 112, the pixel electrode layer 113, and the common electrode layer 114 can be respectively formed on the first substrate 110 in that order. The common electrode layer 114 and the pixel electrode layer 113 can be made of transparent conductive materials, such as indium tin oxide (ITO). When a voltage is applied to the common electrode layer 114 and the pixel electrode layer 113, an electrical field between the common electrode layer 114 and the pixel electrode layer 113 can drive the liquid crystal molecules in the liquid crystal layer 30 to rotate.

The opposite substrate can include a second substrate 120 and a color filter 121 located at a side of the second substrate 120 adjacent to the liquid crystal layer 13. In at least one embodiment, both the first substrate 110 and the second substrate 120 can be a transparent substrate, a translucent substrate, a non-transparent substrate, or a flexible substrate.

Further, in this embodiment, the pixel electrode layer 113 defines a plurality of first openings 1132, and the common electrode layer 114 defines a plurality of second openings 1141. The first openings 1132 and the second openings 1141 are staggered. In other embodiment, if the LCD panel 10 is the FFS LCD, the first openings 1131 and the second openings 1141 can be omitted.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A method for manufacturing a thin film transistor (TFT) substrate comprising:
   forming a TFT on a substrate, the TFT comprising a gate, a source, a drain, and a channel layer, wherein the source and the drain respectively are located at opposite sides of the channel layer;

forming a passivation layer on the TFT; and
performing an oxygen implanting process to implant oxygen ions into the channel layer in an environment having an air pressure greater than a standard atmospheric pressure;
wherein the channel layer comprises a first portion away from the substrate and a second portion adjacent to the substrate; an oxygen ion concentration in the first portion of the channel layer is greater than an oxygen ion concentration in the second portion of the channel layer.

2. The method according to claim 1, wherein the environment is an annealing chamber.

3. The method according to claim 2, wherein the air pressure in the annealing chamber is between two times the standard atmospheric pressure and seven times the standard atmospheric pressure.

4. The method according to claim 2, wherein the air pressure in the annealing chamber is between three times the standard atmospheric pressure and five times the standard atmospheric pressure.

5. The method according to claim 2, wherein a temperature in the annealing chamber is between 200 degrees centigrade and 500 degrees centigrade.

6. The method according to claim 5, wherein the temperature in the annealing chamber is 350 degrees centigrade.

7. The method according to claim 2, wherein an oxygen ion concentration in the annealing chamber is between 20% and 50%.

8. A thin film transistor (TFT) substrate comprising:
a substrate;
a TFT formed on the substrate, the TFT comprising a gate, a source, a drain, and a channel layer, wherein the source and the drain respectively are located at opposite sides of the channel layer; and
a passivation layer formed on the TFT and covering the TFT;
wherein the channel layer comprises oxygen ions which are implanted into the channel layer by an oxygen implanting process performed in an environment having an air pressure greater than a standard atmospheric pressure;
wherein the channel layer comprises a first portion away from the substrate and a second portion adjacent to the substrate; an oxygen ion concentration in the first portion of the channel layer is greater than an oxygen ion concentration in the second portion of the channel layer.

9. The TFT according to claim 8, wherein the oxygen implanting process is performed from a side of the passivation layer away from the substrate to increase an oxygen concentration of the channel layer.

10. The TFT according to claim 8, wherein the oxygen implanting process is performed in an annealing chamber, and the air pressure in the annealing chamber is between two times the standard atmospheric pressure and seven times the standard atmospheric pressure.

11. The TFT according to claim 8, wherein the oxygen implanting process is performed in an annealing chamber, and the air pressure in the annealing chamber is between three times the standard atmospheric pressure and five times the standard atmospheric pressure.

12. A liquid crystal display (LCD) panel comprising:
a thin film transistor (TFT) substrate, an opposite substrate, and a liquid crystal layer between the TFT substrate and the opposite substrate, the TFT substrate comprising:
a first substrate;
a TFT formed on the first substrate, the TFT comprising a gate, a source, a drain, and a channel layer, wherein the source and the drain are respectively located at opposite sides of the channel layer; and
a passivation layer formed on the TFT;
wherein the channel layer comprises oxygen ions which are implanted into the channel layer by an oxygen implanting process performed in an environment having an air pressure greater than a standard atmospheric pressure;
wherein the channel layer comprises a first portion away from the first substrate and a second portion adjacent to the first substrate; an oxygen ion concentration in the first portion of the channel layer is greater than an oxygen ion concentration in the second portion of the channel layer.

13. The LCD panel according to claim 12, wherein the oxygen implanting process is performed from a side of the passivation layer away from the substrate to increase an oxygen concentration of the channel layer.

14. The LCD panel according to claim 12, wherein the oxygen implanting process is performed in an annealing chamber, and the air pressure in the annealing chamber is between two times the standard atmospheric pressure and seven times the standard atmospheric pressure.

15. The LCD panel according to claim 12, wherein the oxygen implanting process is performed in an annealing chamber, and the air pressure in the annealing chamber is between three times the standard atmospheric pressure and five times the standard atmospheric pressure.

16. The LCD panel according to claim 12, wherein the opposite substrate comprises a second substrate and a color filter located a side of the second substrate adjacent to the liquid crystal layer.

* * * * *